United States Patent [19]
Segawa et al.

[11] Patent Number: 4,797,585
[45] Date of Patent: Jan. 10, 1989

[54] PULSE GENERATING CIRCUIT IN A SEMICONDUCTOR INTEGRATED CIRCUIT AND A DELAY CIRCUIT THEREFOR

[75] Inventors: Hiroshi Segawa; Tetsuya Matsumura, both of Itami, Japan

[73] Assignee: Mitsubishi Denki Kabushiki Kaisha, Tokyo, Japan

[21] Appl. No.: 30,662

[22] Filed: Mar. 27, 1987

[30] Foreign Application Priority Data

Mar. 31, 1986 [JP] Japan .................. 61-74965

[51] Int. Cl.⁴ ............................... H03K 5/159
[52] U.S. Cl. ....................... 307/594; 307/597; 307/602; 307/605; 307/606; 328/55
[58] Field of Search ............. 328/55; 307/594, 595, 307/597, 601, 602, 603, 605, 600, 606, 590, 592, 593, 246, 570

[56] References Cited

U.S. PATENT DOCUMENTS

| | | | |
|---|---|---|---|
| 3,479,603 | 11/1969 | Overstreet, Jr. | 307/595 |
| 3,767,939 | 10/1973 | Chamran et al. | 307/246 |
| 3,883,810 | 5/1975 | Taeussel | 307/606 |
| 4,122,361 | 10/1978 | Clemen et al. | 307/246 |
| 4,430,587 | 2/1984 | Tennyson | 307/605 |
| 4,470,017 | 9/1984 | Eder | 307/358 |
| 4,504,749 | 3/1985 | Yoshida | 307/602 |
| 4,626,716 | 12/1986 | Niki | 307/602 |
| 4,633,308 | 12/1986 | Dukes et al. | 328/55 |
| 4,638,191 | 1/1987 | Baumgartner et al. | 307/606 |
| 4,677,439 | 6/1987 | Skrzypczak | 328/55 |
| 4,710,653 | 12/1987 | Yee | 328/55 |
| 4,737,670 | 4/1988 | Chan | 307/602 |

FOREIGN PATENT DOCUMENTS

0013031 1/1983 Japan .................. 307/246

OTHER PUBLICATIONS

DD-Z, Radio Fernsehen Elektronik, No. 31 (1982), Number 10, p. 640.
Introduction to VLSI Systems, p. 22, Carrer A. Mead, Addison-Wesley Publishing Co., Inc. 1980.
VLSI Design, pp. 269–272; Makoto Watanabe, Kikaku Center, 1983.
Digital System Design, p. 134, Kunio Ikai, CQ Shuppan Kabushiki Kaisha.
Tietze/Schenk: Halbleiter Schaltungstechnik, 5th edition, Berlin: Springer Verlag 1980, pp. 91–92.
Kuhnel, C.: Pulsgenerator mit steuerbarem Tastverhaltnis, in: Radio Fernseh Elektronik, 1983, 1; pp. 51, 55.

Primary Examiner—Stanley D. Miller
Assistant Examiner—Huy K. Mai
Attorney, Agent, or Firm—Saidman, Sterne Kessler & Goldstein

[57] ABSTRACT

In a semiconductor integrated circuit, a pulse generating circuit comprises a delay circuit receiving a first signal and producing a second signal delayed with respect to the first signal. The delay circuit has a delay time which is variable by a control signal supplied from a control circuit. The first and the second signals are inputted to a logic circuit, which thereby produces a pulse having a duration corresponding to the delay time of the second signal with respect to the first signal.

12 Claims, 3 Drawing Sheets

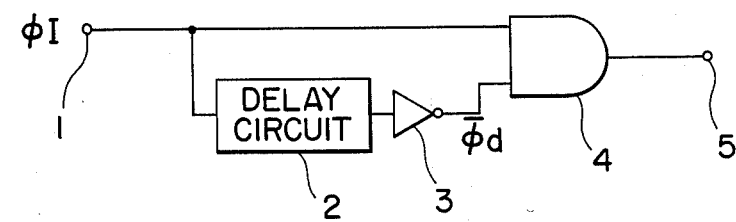
F I G. I   PRIOR ART
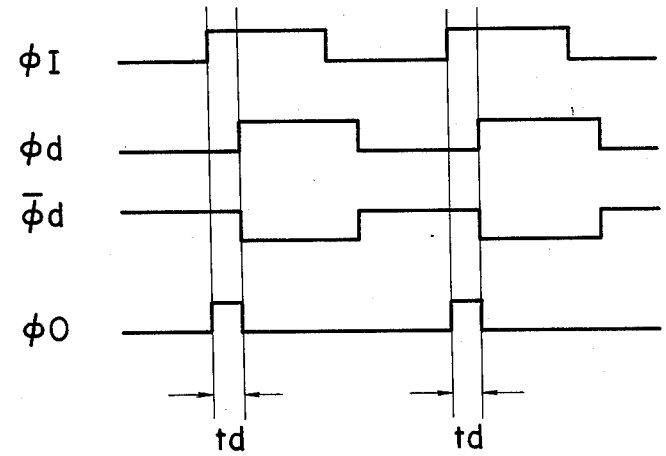
F I G. 2   PRIOR ART

PULSE GENERATING CIRCUIT IN A
SEMICONDUCTOR INTEGRATED CIRCUIT AND
A DELAY CIRCUIT THEREFOR

BACKGROUND OF THE INVENTION

The present invention relates to a pulse generating circuit in a semiconductor integrated circuit and a delay circuit therefor.

FIG. 1 shows a conventional pulse generating circuit formed in a semiconductor integrated circuit. Applied to an input terminal 1 is a signal $\phi$I having a leading edge such as one of a rectangular waveform, as illustrated in FIG. 2. The input signal $\phi$I is supplied to a delay circuit 2, which produces a delayed signal $\phi$d. The delayed signal $\phi$d is passed through an inverter 3 to become an inverted delayed signal $\overline{\phi d}$, which is then supplied to an AND gate 4 together with the input signal $\phi$I. The output signal $\phi$O of the AND gate 4 is a pulsative signal having a duration td corresponding to the delay time of the delay circuit 2. The delay time of the delay circuit 2 is decided during designing of the semiconductor integrated circuit. This means that the duration of the pulse cannot be adjusted or altered after fabrication of the integrated circuit. In certain applications, this is inconvenient.

SUMMARY OF THE INVENTION

An object of the invention is to provide a pulse generating circuit whose output pulse duration can be adjusted by means of an electrical signal applied from the outside, after fabrication of the integrated circuit.

According to the present invention, there is provided a pulse generating circuit comprising
a first input terminal for receiving a first signal,
a delay circuit receiving the first signal and producing a second signal delayed with respect to the first signal,
the delay circuit having a delay time which is variable by a control signal supplied from the outside,
control means connected for supplying the control signal to the delay circuit to vary the delay time, and
logic circuit means for receiving the first and the second signals and producing a pulse having a duration corresponding to the delay time of the second signal with respect to the first signal.

BRIEF DESCRIPTION OF THE DRAWINGS

In the accompanying drawings:

FIG. 1 is a circuit diagram showing a conventional pulse generating circuit;

FIG. 2 is a timing chart showing various signals which appear in the pulse generating circuit of FIG. 1;

DETAILED DESCRIPTION OF THE PREFERRED EMBODIMENTS

Figure 3:
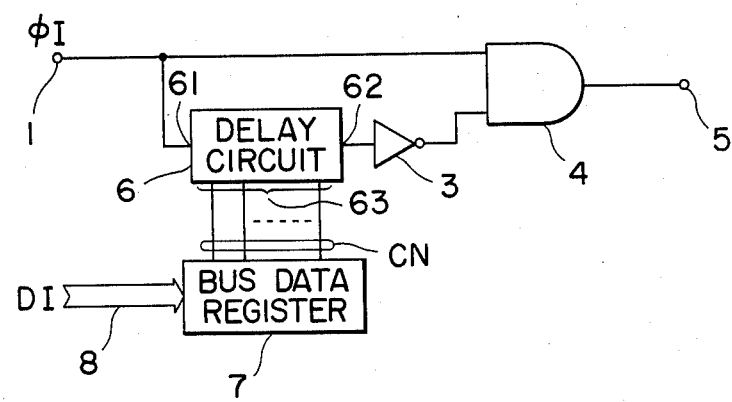
FIG. 3 is a circuit diagram showing a pulse generating circuit of an embodiment according to the present invention.

FIG. 3 shows an embodiment of a pulse generating circuit according to the invention.

The pulse generating circuit shown in FIG. 3 comprises an input terminal 1 connected for receiving a first signal having an edge, such as a leading edge or a trailing edge. A typical example of such a signal is one $\phi$I having a rectangular waveform shown in FIG. 4.

Figure 4:
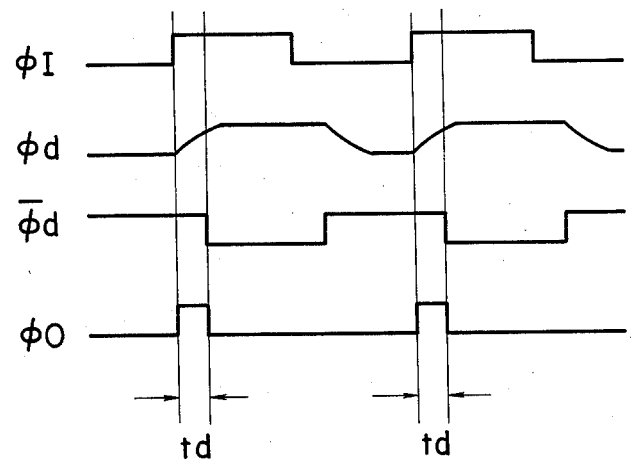
FIG. 4 is a timing chart showing various signals which appear in the pulse generating circuit of FIG. 3.

A delay circuit 6 has its input terminal 61 connected to the input terminal 1 to receive the first signal $\phi$I and produces at its output terminal 62 a second signal, such as the one $\phi$d shown in FIG. 4 which is delayed with respect the first signal $\phi$I. The delay time of the delay circuit 6 is variable by a signal supplied from the outside. In the illustrated embodiment, the delay circuit 6 has control terminals 63 for receiving control signals CN, by which the delay time can be varied.

The control signals CN are shown to be supplied from a bus data register 7, which may be in the form of a shift register receiving serially-transmitted bus data and converting them into parallel data, constituting the control signals CN.

Figure 5:
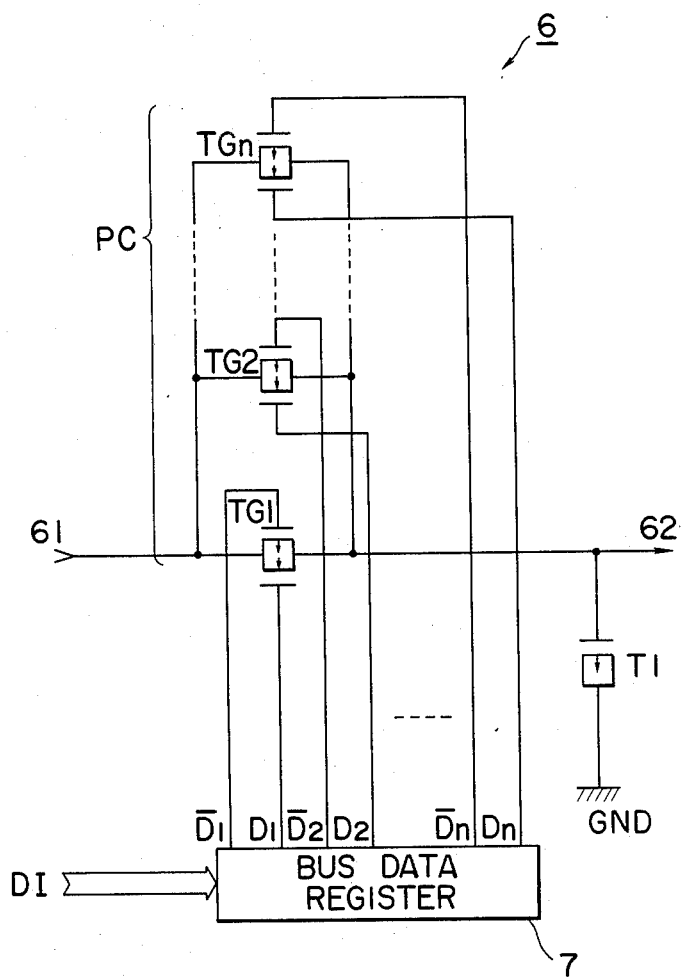
FIG. 5 is a circuit diagram showing an example of a delay circuit 6 in FIG. 3.
Figure 6:
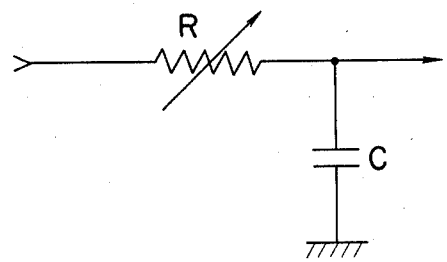
FIG. 6 is a circuit diagram showing an equivalent circuit of the delay circuit of FIG. 5.

FIG. 5 shows an example of the delay circuit 6. As illustrated, the delay circuit 6 of this example comprises a plurality of (n) MOS transistor switching circuits TG1 through TGn connected in parallel with each other. The parallel connection of the MOS transistor switching circuit TG1 through TGn is connected between the input terminal 61 and the output terminal 62. The delay circuit 6 also comprises a capacitance element T1 connected between the output terminal 62 and a power source (e.g., ground) terminal GND. The capacitance element T1 is shown to comprise a MOS transistor having its drain and source connected to each other. Thus, the parallel connection of the MOS transistor switching circuit TG1 through TGn and the capacitance element T1 form in combination an RC delay circuit shown in FIG. 6 with a variable resistor R and fixed capacitance C. The overall resistance of the parallel connection PC can be varied by controlling the conduction of the MOS transistor switching circuits TG1 through TGn, or more particularly by changing the number of the conducting switching circuits.

Each of the switching circuits TG1 through TGn comprises a transfer gate or a transmission gate comprising an n-channel MOS transistor and a p-channel MOS transistor connected in parallel with each other. The semiconductor region in which the channel of the n-channel MOS transistor is formed is connected to the lower power source, i.e., ground GND, while the semiconductor region in which the channel of the p-channel MOS transistor is formed is connected to the higher power source, i.e., Vcc=5V. The gates of the n-channel and the p-channel transistors are connected to receive complementary signals, such as D1 and $\overline{D1}$. With such a connection, the parallel connection of the transistors serves as a resistor, when they are made conductive by application of appropriate complementary signals (5V for the n-channel MOS transistor and 0V for the p-channel MOS transistor). When the gate signals are inverted or not applied, the transistors are nonconductive.

The gates of the transistors of the switching circuits TG1 through TGn are connected to receive complementary control signals D1, $\overline{D1}$ through Dn, $\overline{Dn}$ from the bus data register 7. To provide the complementary control signal D1, $\overline{D1}$ through Dn, $\overline{Dn}$, the bus data register 7 comprises the same number of stages as the switching circuits TG1 through TGn.

The bus data transmitted through the data bus to the bus data register 7 contains information indicating whether or not the transistors of each of the switching circuits TG1 through TGn should be made ON or OFF. The information is held in each stage of the bus data register 7, and is outputted as each pair of control signals D1, $\overline{D1}$ through Dn, $\overline{Dn}$. The control signals D1, $\overline{D1}$ through Dn, $\overline{Dn}$ are applied to the gates of the transistors of the respective switching circuits TG1 through TGn. The switching circuits TG1 through TGn are thereby selectively made conductive. As the number of the switching circuits which are ON is increased, the overall resistance of the parallel connection of the switching circuits TG1 through TGn is decreased. The delay time of an RC delay circuit is dependent on the product of the resistance of the resistance element and the capacitance of the capacitance element. Therefore, as the number of the switching circuits which are ON is increased, the delay time is shortened.

There is also provided an inverter 3 and an AND gate 4 having functions similar to those shown in and described with reference to FIG. 1. That is, the inverter 3 produces an inversion $\overline{\phi d}$, shown in FIG. 4, of the output of the delay circuit 6, and the AND gate 4 produces the logical product of the signals $\phi I$ and $\overline{\phi d}$. The logical product forms a pulse $\phi O$ having a duration corresponding to the delay time td of the leading edge of the signal $\phi d$ with respect to the leading edge of the signal $\phi I$. The pulse $\phi O$ thus produced is outputted through an output terminal 5.

In the embodiment described, the bus data register 7 is used for controlling the conduction of the switching circuits TG1 through TGn. But any other form of conduction control means may be used.

In the embodiment illustrated, the combination of the inverter 3 and the AND gate 4 is used to produce a pulse whose duration corresponds to the delay time of the output of the delay circuit 6 with respect to the input signal. Any other logic circuit may be used in place. If, for instance, the inverter 3 is placed on the input side of the delay circuit 6, the AND gate 4 may be connected to receive, directly, the output of the delay circuit 6.

Although a specific form of a delay circuit is shown, it may be replaced by any other form of a delay circuit as long as the delay time is variable by a signal supplied from the outside.

As has been described, according to the invention, the delay time of the delay circuit and hence the duration (width) of the pulse can be varied by a signal supplied from the outside of the pulse generating circuit. Therefore, the duration of the pulse can be readily varied or adjusted after fabrication of the integrated circuit. Moreover, if the delay time is varied by bus data, the duration of the pulse can be varied or adjusted by means of bus control.

What is claimed is:

1. A pulse generating circuit in a semiconductor integrated circuit comprising:
   a first input terminal for receiving a first signal,
   a delay circuit receiving the first signal and producing a second signal delayed with respect to the first signal,
   the delay circuit having delay time which is variable by a control signal supplied from the outside,
   control means connected for supplying the control signal to the delay circuit to vary the delay time, and
   logic circuit means for receiving the first and the second signals and producing a pulse having a duration corresponding to the delay time of the second signal with respect to the first signal, wherein the delay circuit comprises
   an input terminal,
   an output terminal,
   a plurality of MOS transistor switching circuits connected in parallel with each other, the parallel connection of the MOS transistor switching circuits being connected between the input and the output terminal,
   a capacitance element connected between the output terminal and a power source terminal, and
   conduction control means for controlling the conduction of the MOS transistor switching circuits to vary the overall resistance of the parallel connection of the MOS transistor switching circuits.

2. A circuit according to claim 1, wherein said conduction control means comprises a data bus transmitting said control signal in the form of a set of control signals for controlling the conduction of the MOS transistor switching circuits.

3. A circuit according to claim 1, wherein said conduction control means comprises a shift register receiving serially transmitted signals and producing at the respective stages said control signals in the form of parallel control signals for controlling the conduction of the MOS transistor circuits.

4. A circuit according to claim 1, wherein each of the MOS transistor switching circuits comprises a transmission gate comprising a first and a second MOS transistors connected in parallel with each other and having channels of different conductivity types.

5. A circuit according to claim 4, wherein said conduction control circuit supplies the control signals to the gates of the MOS transistors.

6. A circuit according to claim 5, wherein said conduction control circuit comprises a shift register receiving serially transmitted signals and producing at each of the stages a pair of complementary control signals constituting each of said control signals and supplies them to the respective gates of the pair of MOS transistors forming the transmission gate.

7. A delay circuit with a variable delay time comprising
   an input terminal,
   an output terminal,
   a plurality of MOS transistor switching circuits connected in parallel with each other, the parallel connection of the MOS transistor switching circuits being connected between the input and the output terminal,
   a capacitance element connected between the output terminal and a power source terminal, and
   conduction control means for controlling the conduction of the MOS transistor switching circuits to vary the overall resistance of the parallel connection of the MOS transistor switching circuits.

8. A circuit according to claim 7, wherein said conduction control means comprises a data bus transmitting a control signal in the form of a set of control signals for controlling the conduction of the MOS transistor switching circuits.

9. A circuit according to claim 7, wherein said conduction control means comprises a shift register receiving serially transmitted signals and producing at the respective stages said control signals in the form of parallel control signals for controlling the conduction of the MOS transistor circuits.

10. A circuit according to claim 7, wherein each of the MOS transistor switching circuits comprises a transmission gate comprising a first and a second MOS transistors connected in parallel with each other and having channels of different conductivity types.

11. A circuit according to claim 10, wherein said conduction control circuit supplies the control signals to the gates of the MOS transistors.

12. A circuit according to claim 11, wherein said conduction control circuit comprises a shift register receiving serially transmitted signals and producing at each of the stages a pair of complementary control signals constituting each of the said control signals and supplies said pair of complementary control signals to the respective gates of the pair of MOS transistors forming the transmission gate.

* * * * *